(12) United States Patent
Knittel et al.

(10) Patent No.: US 8,785,858 B2
(45) Date of Patent: Jul. 22, 2014

(54) SOLAR SENSOR FOR THE DETECTION OF THE DIRECTION OF INCIDENCE AND THE INTENSITY OF SOLAR RADIATION

(75) Inventors: Otto Knittel, Soest (DE); Bernd Stich, Bueren (DE); Ralph Trapp, Paderborn (DE); Dirk Nagel, Paderborn (DE)

(73) Assignee: Behr-Hella Thermocontrol GmbH, Stuttgart (DE)

( * ) Notice: Subject to any disclaimer, the term of this patent is extended or adjusted under 35 U.S.C. 154(b) by 1117 days.

(21) Appl. No.: 12/674,370

(22) PCT Filed: Aug. 28, 2008

(86) PCT No.: PCT/EP2008/061293
§ 371 (c)(1),
(2), (4) Date: Jun. 13, 2011

(87) PCT Pub. No.: WO2009/027459
PCT Pub. Date: Mar. 5, 2009

(65) Prior Publication Data
US 2011/0240862 A1    Oct. 6, 2011

(30) Foreign Application Priority Data

Aug. 29, 2007  (DE) .......................... 10 2007 041 002

(51) Int. Cl.
*G01J 5/02* (2006.01)
(52) U.S. Cl.
USPC ....................................................... 250/349
(58) Field of Classification Search
USPC ...................................... 250/349, 203.4, 239
See application file for complete search history.

(56) References Cited

U.S. PATENT DOCUMENTS

| 5,400,964 A | * | 3/1995 | Freiberger ................. 236/91 C |
| 5,587,580 A | * | 12/1996 | Venier et al. ............... 250/206.1 |
| 6,521,882 B1 | | 2/2003 | Sumiya et al. |
| 7,718,948 B2 | * | 5/2010 | Kiesel et al. ................. 250/216 |

FOREIGN PATENT DOCUMENTS

| DE | 19913955 A1 | 11/1999 |
| DE | 10102353 A1 | 8/2002 |

(Continued)

OTHER PUBLICATIONS

International Search Report and Written Opinion of corresponding PCT Application No. PCT/EP2008/061293 dated Mar. 26, 2009 (9 pages).

*Primary Examiner* — David Porta
*Assistant Examiner* — Hugh H Maupin
(74) *Attorney, Agent, or Firm* — Shumaker & Sieffert, P.A.

(57) ABSTRACT

A solar sensor for the detection of the direction of incidence and the intensity of solar radiation comprises a housing (12) made of a plastic material that is permeable to at least some of the solar radiation, the housing (12) having a curved side (14) facing the incident solar radiation and the housing (12) optically acting as a lens and having an internal focal plane (26) defined by the lens characteristics thereof. At least two photosensors (16) are embedded in the plastic material of the housing (12), each photosensor (16) having a sensor area (18) sensitive to at least the part of the radiation to which the plastic material is permeable, and the sensor areas (18) of the photosensors (16) being arranged in a substantially common plane (19) located in front of or behind the focal plane (26), seen from side (14) facing the incident solar radiation. The direction of incidence of the solar radiation is determinable based on the intensities of the solar radiation received by the sensor areas (18) of the photosensors (16).

18 Claims, 3 Drawing Sheets

(56) References Cited

FOREIGN PATENT DOCUMENTS

Figure 1:
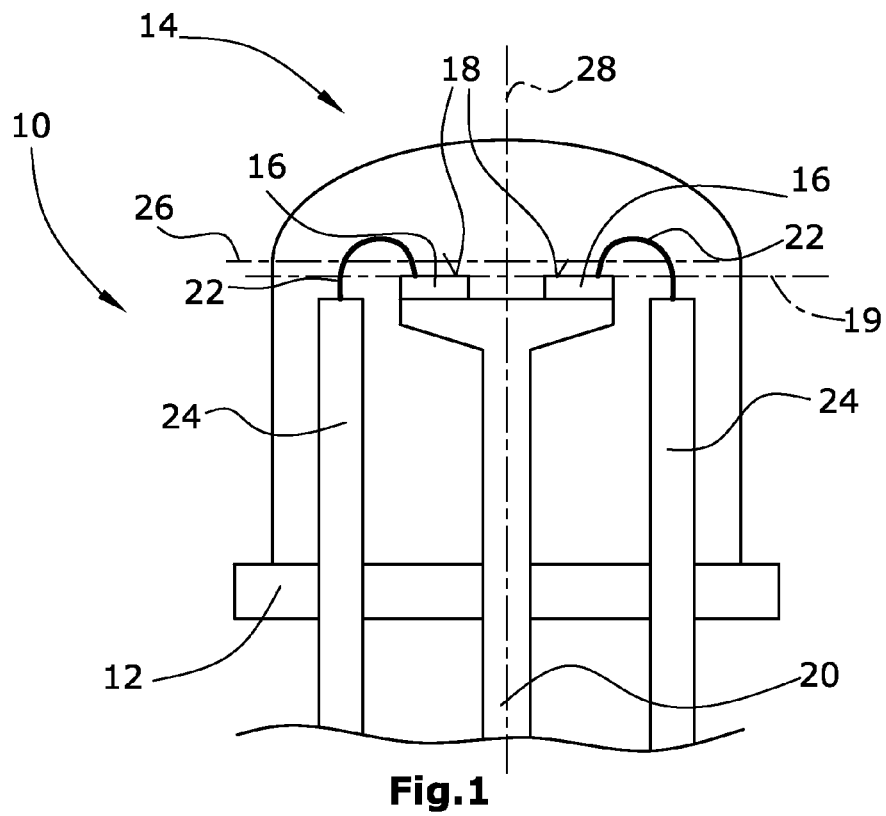

| | | |
|---|---|---|
| DE | 102004053958 B3 | 9/2005 |
| EP | 0492352 A2 | 7/1992 |
| EP | 1460448 A2 | 9/2004 |
| JP | 58192366 | 11/1983 |
| JP | 04231808 | 8/1992 |
| JP | 06160182 | 6/1994 |
| JP | 09311070 | 12/1997 |
| JP | 2002296107 | 10/2002 |
| KR | 1020040005307 A | 1/2004 |

* cited by examiner

SOLAR SENSOR FOR THE DETECTION OF THE DIRECTION OF INCIDENCE AND THE INTENSITY OF SOLAR RADIATION

The invention refers to a solar sensor for the detection of the direction of incidence and the intensity of solar radiation.

In various technical applications it is sometimes necessary to have information on the instant solar radiation at hand, both with respect to its intensity and to its direction of incidence. One possible application for a solar sensor is an air condition system of a motor vehicle, wherein the heating of the vehicle interior caused by solar radiation should be detected for compensation purposes.

Prior art knows concepts for solar sensors comprising a plurality of individual photo diodes that are inclined. Examples of such solar sensors are found in DE 101 02 353 A1, DE 10 2004 053 958 B3 and EP 1 460 448 A2. Other known concepts include light guides, diffuser elements and covers (Lexan caps, i.e. daylight filters), which are needed to detect the direction of incidence and the intensity of solar radiation. The inclination of the photo diodes makes the manufacture (especially the assembly) of the solar sensor more difficult, whereas additional components such as light guides, diffuser elements and Lexan cap further result in an increase in the price of a solar sensor. Moreover, the known solar sensor of the above mentioned types are disadvantageous in that the sensor elements have to be adjusted and calibrated with respect to each other (adjustment and calibration of the solar sensor).

It is an object of the invention to provide a solar sensor for the detection of the direction of incidence and the intensity of solar radiation, which features a simplified structural concept and sensor elements that are cost-effective to manufacture and to assemble.

In order to achieve this object, the invention provides a solar sensor for the detection of the direction of incidence and the intensity of solar radiation, the solar sensor comprising a housing made of a plastic material that is permeable to at least some of the solar radiation, the housing having a curved side facing the incident solar radiation and the housing optically acting as a lens and having an internal focal plane defined by the lens characteristics thereof, and at least two photosensors that are embedded in the plastic material of the housing, each photosensor having a sensor area sensitive to at least the part of the radiation to which the plastic material is permeable, and the sensor areas of the photosensors being arranged in a substantially common plane located in front of or behind the focal plane (and substantially in parallel therewith), seen from side facing the incident solar radiation, and the direction of incidence of the solar radiation being determinable based on the intensities of the solar radiation received by the sensor areas of the photosensors.

In the solar sensor of the present invention, at least two photosensors (e.g. photo diodes) are embedded in a plastic material mass of a housing. This housing may for instance be a housing similar to the one known from wired photo diodes (THT technology). However, housings of the SMD technology are also conceivable. The plastic material used is permeable to at least a part of the solar radiation (e.g. the IR part). The housing has a side facing the incident solar radiation, which can be exposed to solar radiation and is curved, i.e. spherical. Because of its geometric shape (especially at the incidence side), the housing optically acts as a lens whose characteristic defines a focal plane located within the housing and within which the focus of the incident solar radiation is located or—depending on the direction of incidence—within which it moves. This focal plane extends substantially at right angles to the optical axis of the solar sensor.

Each photosensor of the present solar sensor has a sensor area sensitive to that part of the solar radiation to which the plastic material of the housing is permeable. The sensor areas of the at least two photosensors are situated substantially in a common plane which is situated outside the focal plane, i.e. in front of or behind the focal plane when looking at the side facing the incident solar radiation. The arrangement of the sensor areas of the photosensors is such that the optical axis is centric thereto.

Due to the lens characteristic of the housing, each photosensor receives different magnitudes of solar radiation intensity, depending on the direction of incidence of the solar radiation. One can then conclude on the direction of incidence of the solar radiation from the combination of the individual signals of the photo sensors. Moreover, information about the intensity of the solar radiation is obtained.

It is an essential feature of the present solar sensor that all photosensors are arranged substantially in planar orientation in a common (standard) housing, the photosensors specifically being embedded in plastic material, as is known from conventional light emitting diodes and photo diodes. Arranging the photosensors outside the focal plane is advantageous in that, for different angles of incidence of the radiation with respect to the optical axis of the solar sensor (perpendicular to the housing surface), a maximum possible part of the radiation impinges on the sensor areas of the photosensors, yet the solar radiation causes different levels of irradiation of the individual photosensors depending on the angle of incidence.

According to the invention, at least two photosensors are required. However, it is suitable to provide three or more photosensors. When three photosensors are provided, these are arranged such that their sensor areas are each rotated and offset by 120° with respect to each other. With four photosensors, their sensor areas are arranged like a matrix in a rectangular shape. If more than four photosensors are present, these are arranged such that their sensor areas define an overall area having the outer contour of a (possibly equilateral) polygon.

Advantageously, the (semiconductor) photosensors are arranged and/or formed on a common substrate, the photosensors being designed as photo diodes or IR sensors. Because they are formed in a common (semiconductor) substrate (i.e. because of the photosensors being manufactured together), an adjustment or calibration of the photosensors is not required. Suitably, electric connector elements protrude from the housing, which are electrically connected with the photosensors, the connector elements being designed as connector elements of a plug.

The solar sensor of the present invention requires neither additional light guides, nor diffuser elements, nor Lexan caps. Further, it is not necessary to perform a process of calibrating the photosensors with respect to each other. Another advantage of the solar sensor of the present invention is that all functional elements are integrated into a photo-optical component and thus all desired optical characteristics of the (2D/3D) solar sensor are produced only by the component itself—without any additional structural components.

The features and advantages of the solar sensor of the invention may be listed as follows:

At least two photo-sensitive sensors (photosensors) provided in a common housing are arranged in a planar orientation and are used to detect solar radiation, whereby a single integral component is obtained.

The optically transparent housing may include filter and diffuser materials that allow for a selective detection of solar radiation with respect to the wavelength (filter) and also a homogenization of the incident radiation (diffuser).

With three photosensors, these are positioned in a 120° arrangement.

If four photosensors are provided, the photosensors are positioned in a 90° arrangement taking the shape of a rectangle.

With more than four sensors, these are arranged in the form of an equilateral polygon corresponding to the number of photosensors.

The photosensors are arranged on a lead frame (connector elements) or another carrier structure that allows the tapping of the electrical signals at the individual photosensors; the lead frame may simultaneously function as a plug with which the component can be electrically connected with electronics.

Using standard soldering methods, the lead frame, realized in THT or SMD technology, may be connected electrically to an external circuit board for a processing of the signals.

The housing is made of standard plastic materials known per se for optical components (e.g. daylight filtering characteristic).

The housing can be produced using standard production methods for optical components.

Due to its geometrical shape, the housing guarantees that the incident solar intensity as well as the direction of radiation of the sun at the position of the solar sensor can be determined from the geometrical configuration of the solar sensor.

If more than three photosensors are used, the ratio of direct solar radiation to indirect (diffuser) solar radiation can be determined.

Figure 2:
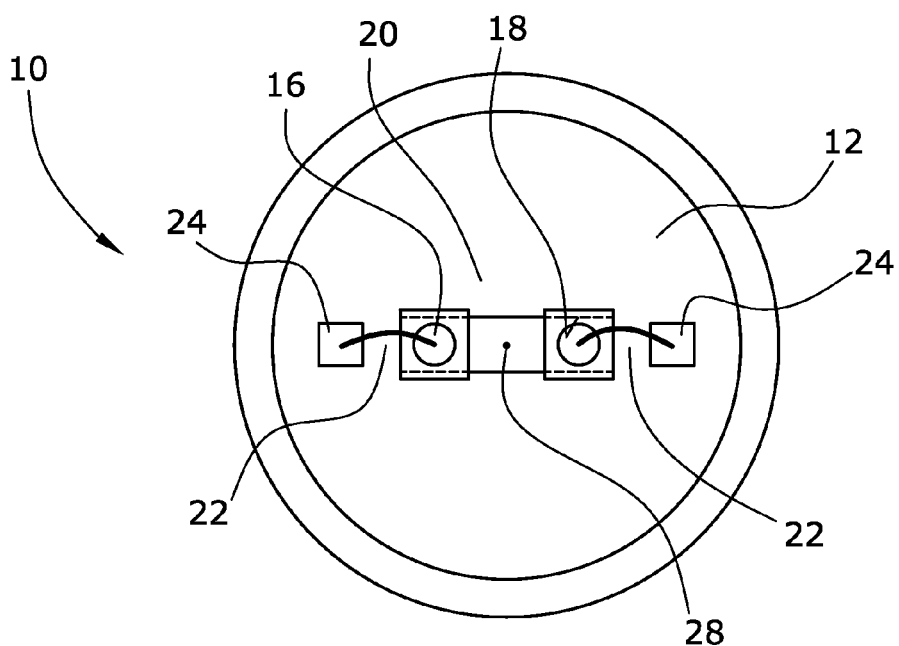
Figure 3:
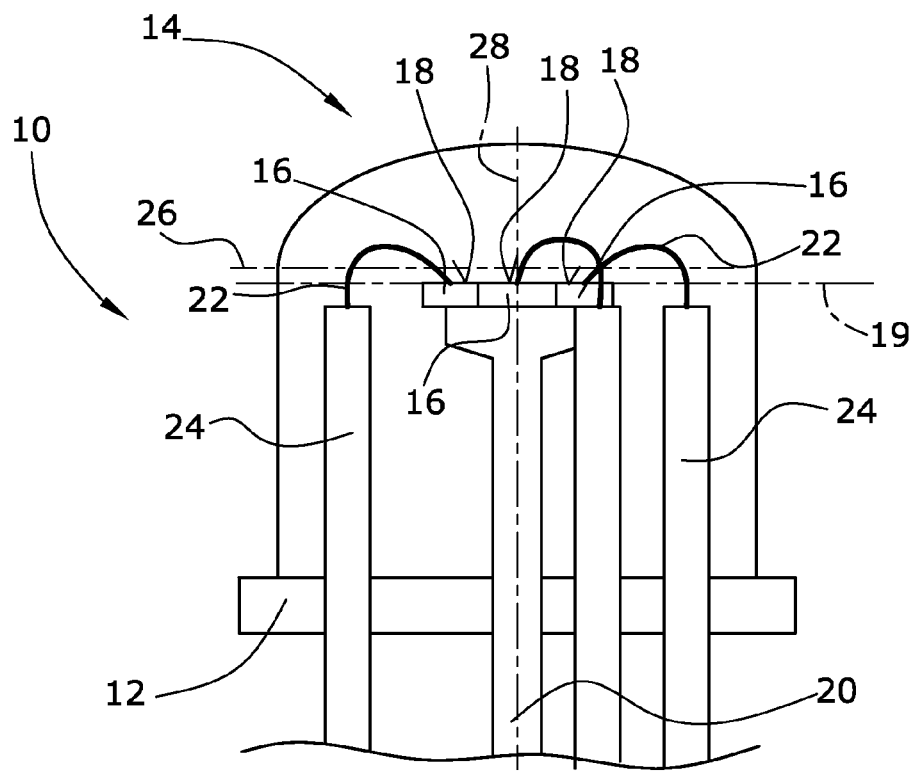
Figure 4:
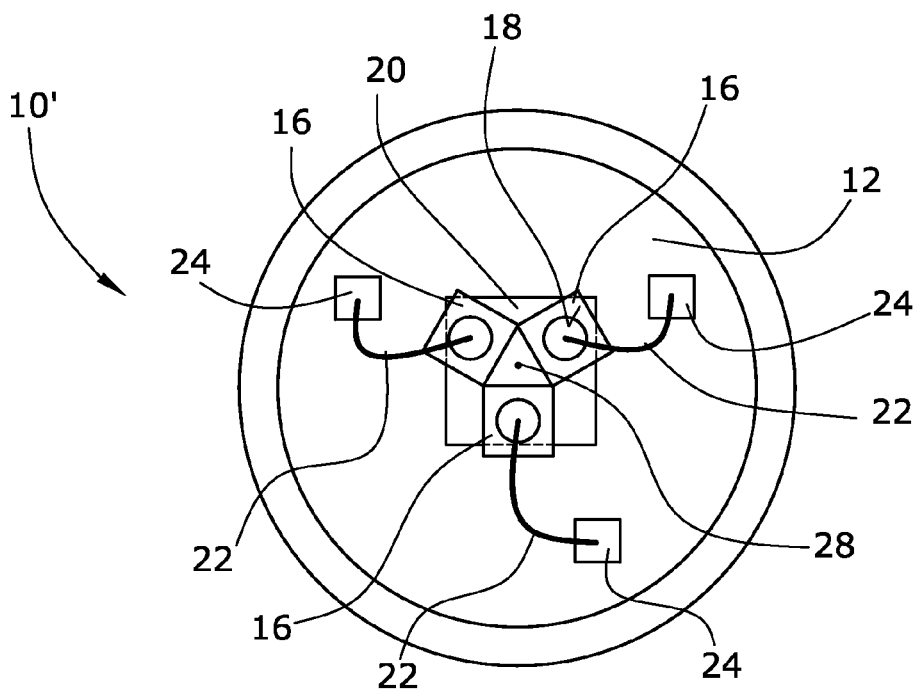
Figure 5:
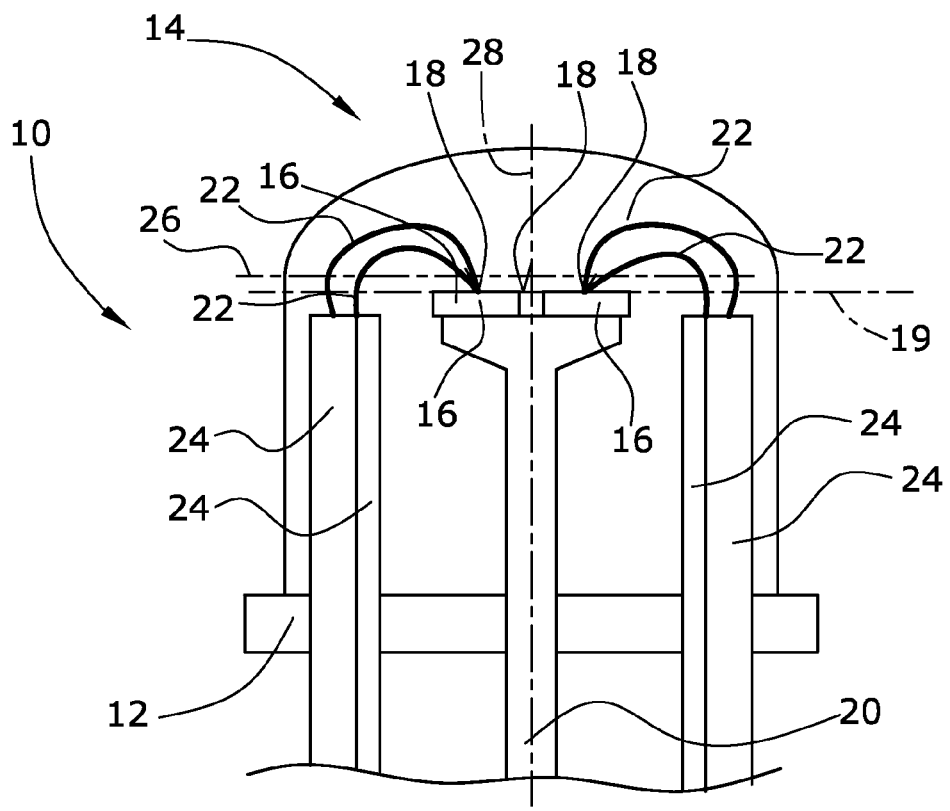
Figure 6:
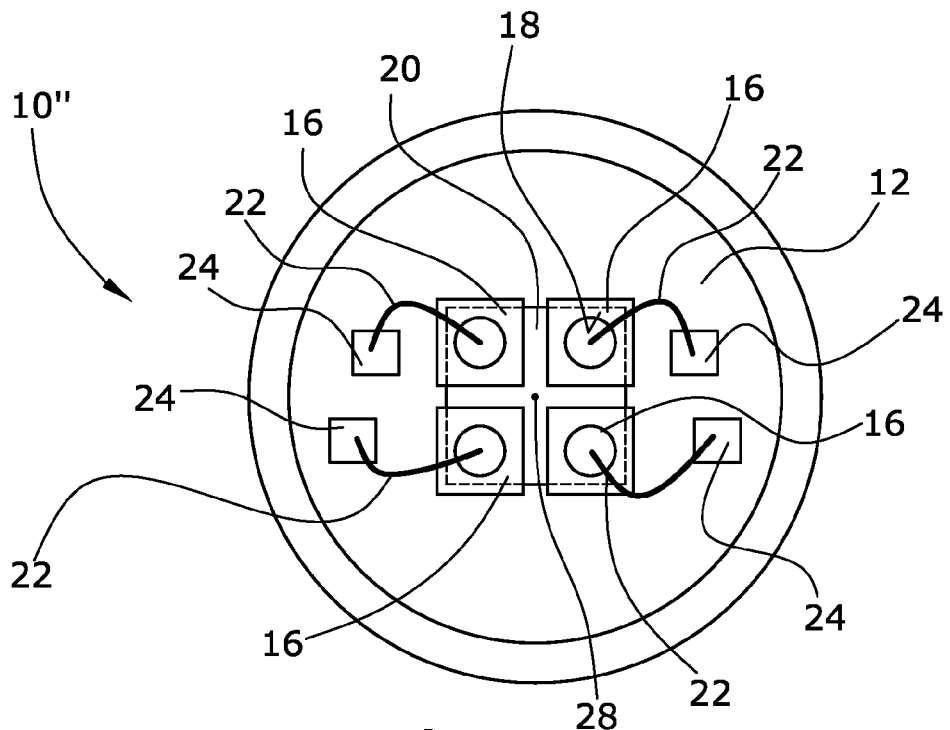

The following is a detailed description of the invention with reference to several embodiments thereof and to the drawing. The Figures show:

FIGS. 1 and 2 a side elevational view and a top plan view on a solar sensor comprising two photosensors, according to a first embodiment of the invention, FIGS. 3 and 4 a side elevational view and a top plan view on a solar sensor comprising three photosensors, according to a second embodiment of the invention, and FIGS. 5 and 6 a side elevational view and a top plan view on a solar sensor comprising four photosensors, according to a third embodiment of the invention.

FIGS. 1 and 2 are a side elevational view and a top plan view of a first embodiment of a solar sensor 10. The solar sensor 10 comprises a (solid material) housing 12 of a plastic material which, in this embodiment, is permeable to IR radiation and substantially blocks daylight. The side 14 of the housing 12 exposable to incident solar radiation is curved or spherical and is shaped such that the housing 12 is given a lens characteristic in this portion thereof.

Two photo diodes 16 are arranged in the housing 12, whose sensor areas 18 are substantially arranged on a common plane 19. Both photo diodes 16 are situated on a common connector element 20, each photo diode 16 being further connected to different other connector elements 24 via a bonding wire 22. This solar sensor allows for a 2D detection of solar radiation.

FIGS. 3 and 4 illustrate another embodiment of a solar sensor 10'. As far as the elements of the solar sensor 10' are structurally or functionally similar or identical to the elements of the solar sensor 10 in FIGS. 1 and 2, the same reference numerals are used in FIGS. 3 and 4.

In the solar sensor 10', three photo diodes 16 exist that are arranged on the connector element 20 along the edges of an equilateral triangle, i.e. rotated and offset by 120°, respectively. This solar sensor arrangement allows for a 3D detection of solar radiation.

Finally, FIGS. 5 and 6 illustrate still another embodiment of a solar sensor 10". Again, as far as the elements of the solar sensor 10" are structurally or functionally similar or identical to the elements of the solar sensor 10 in FIGS. 1 and 2, the same reference numerals are used in FIGS. 5 and 6.

Different to the solar sensors 10 and 10', the solar sensor 10" has four photo diodes 16 arranged as a rectangle, each of the photo diodes being connected with another connector element via a bonding wire 22.

The functioning of the solar sensors described is respectively based on the idea of placing a plurality of photo diodes in a standard housing for optical sensors such that they react differently but—in a combination of the individual signals unambiguously to the incident solar radiation. In a calculation process implemented in a microcontroller (not illustrated) directly in the solar sensor or in separate electronics, the direction of incidence of the solar radiation, as well as its intensity can then be calculated from the individual signals.

Here, the photo diodes 16 are arranged in a planar manner in the common plane 19, it being possible to use two, three, four or more photo diodes. Possible geometric arrangements in this plane are an equilateral triangle, when three sensors are used, and a square or a rectangle, when four sensors are used. Due to the fact that photo diodes are conventionally manufactured with a square cross section, an arrangement of four sensors is preferable, since these four sensors could be arranged and manufactured together on a single substrate.

The different irradiation of he individual photo sensors depending on the angle of incidence of the solar radiation is caused by the lens characteristic of the housing 12 which optically acts as a lens and is made of a material (plastic material) transparent to the radiation of interest, which material may be enriched with filter or diffuser materials. The lens characteristic is achieved by a bulge (e.g. a spherical form) o the housing surface on the incidence side 14, wherein the radius o the bulge has to be chosen as a function of the vertical and horizontal photo sensor positions as well as in dependence on the size of the sensor areas 18.

In configuring the geometry of the solar sensor, care should be taken that the sensor areas 18 of the photo sensors 16 do not lie in the plane of the focus (see plane 26 in FIGS. 1, 3 and 5) of the solar radiation impinging through the incidence side 14, but is situated in front of or behind the focal plane 26 along the optical axis 28. Thus it is achieved that, for different angles of incidence of the solar radiation with respect to the perpendicular (optical axis 28) of the housing surface, a maximum possible part of the solar radiation impinges on the sensor areas 18 of all photo diodes 16, the solar radiation, however, still causing a different level of irradiation of the individual photo diodes—depending on the angle of incidence.

The unambiguous relation between the angle of incidence and the individual photosensor signals results from the geometric configuration of the housing 12, the optical characteristics of the housing material (diffraction index of the plastic material) and the position of the individual photo diodes 16 within the housing 12 (horizontal and vertical arrangement, as well as the position and the size of the photo diodes 16 and their sensor areas 18 relative to each other, as well as the horizontal trajectory of the optical axis 28 with respect to the arrangement and position of the sensor areas 18).

The solid angle parts that the individual photo diodes can detect overlap. From the respective light intensity at the position of the individual photo diodes, both the direction and the overall intensity of the solar radiation can be determined by means of the respective sensor signal. Further, with more than three photo diodes, conclusions can be made on the ratio of the diffuse part and the direct part of the solar radiation.

The sensitivity tolerance of the sensor areas 18 of the individual photo diodes 16 ranges from low to, ideally, zero, if, due to the production method, the photo diodes 16 are made from the same substrate, respectively. Therefore, tolerances among the photo diodes 16 are negligible. This means that the effort for a calibration of the photo diodes 16, which, in case of conventional solar sensors, may differ in their sensitivity by as much as 20%, can be reduced drastically or even be omitted altogether.

LIST OF NUMERALS

10 solar sensor
10' solar sensor
10" solar sensor
12 housing
14 side facing the incident solar radiation
16 photo diodes
18 sensor areas of the photo diodes
19 plane of the sensor areas
20 connector elements
22 bonding wire
24 connecting elements
26 focal plane
28 optical axis

The invention claimed is:

1. A solar sensor for the detection of the direction of incidence and the intensity of solar radiation, comprising;
    a housing comprising a plastic material that is permeable to at least some of the solar radiation, the housing having a curved solar radiation-incidence side, optically acting as a lens, and having an internal focal plane defined by the lens characteristics thereof; and
    only three photosensors that are embedded in the plastic material of the housing,
    each photosensor having a sensor area sensitive to at least the part of the radiation to which the plastic material is permeable, the sensor areas of the photosensors being arranged in a substantially common plane located in front of or behind the focal plane, seen from the solar radiation-incidence side, wherein the sensor areas are each rotated and offset by 120 degrees with respect to each other, and
    the direction of incidence of the solar radiation being determinable based on the intensities of the solar radiation received by the sensor areas of the photosensors.

2. The solar sensor of claim 1, wherein the plastic material of the housing includes a filter material.

3. The solar sensor of claim 1, wherein the three photosensors are arranged on a common substrate.

4. The solar sensor of claim 1, wherein the three photosensors are configured as photo diodes.

5. The solar sensor of claim 1, wherein the three photosensors comprise IR sensors.

6. The solar sensor of claim 1, wherein electric connector elements protrude from the housing, which are electrically connected with the three photosensors, and wherein the connector elements are designed as connector elements of a plug.

7. The solar sensor of claim 1, wherein the common plane in which the three photosensors are arranged, is arranged substantially parallel with the focal plane.

8. The solar sensor of claim 1, wherein the plastic material of the housing includes a diffuser material.

9. The solar sensor of claim 1, wherein the three photosensors are formed on a common substrate.

10. A solar sensor for the detection of the direction of incidence and the intensity of solar radiation comprising:
    a housing comprising a plastic material that is permeable to at least some of the solar radiation, the housing having a curved solar radiation-incidence side, optically acting as a lens, and having an internal focal plane defined by the lens characteristics thereof, and
    only four photosensors that are embedded in the plastic material of the housing,
    each photosensor having a sensor area sensitive to at least the part of the radiation to which the plastic material is permeable, the sensor areas of the photosensors being arranged in a substantially common plane located in front of or behind the focal plane, seen from the solar radiation-incidence side, wherein the sensor areas are arranged in a rectangular shape in the manner of a matrix, and
    the direction of incidence of the solar radiation being determinable based on the intensities of the solar radiation received by the sensor areas of the photosensors.

11. The solar sensor of claim 10, wherein the plastic material of the housing includes a filter material.

12. The solar sensor of claim 10, wherein the four photosensors are arranged on a common substrate.

13. The solar sensor of claim 10, wherein the four photosensors are configured as photo diodes.

14. The solar sensor of claim 10, wherein the four photosensors comprise IR sensors.

15. The solar sensor of claim 10, wherein electric connector elements protrude from the housing, which are electrically connected with the four photosensors, and wherein the connector elements are designed as connector elements of a plug.

16. The solar sensor of claim 10, wherein the common plane in which the four photosensors are arranged, is arranged substantially parallel with the focal plane.

17. The solar sensor of claim 10, wherein the plastic material of the housing includes a diffuser material.

18. The solar sensor of claim 10, wherein the four photosensors are formed on a common substrate.

* * * * *